United States Patent [19]

Crescenzi, Jr. et al.

[11] 4,423,388
[45] Dec. 27, 1983

[54] RF AMPLIFIER CIRCUIT EMPLOYING FET DEVICES

[75] Inventors: Emil J. Crescenzi, Jr.; Walter T. Wilser, both of Cupertino; Richard W. Oglesbee, Mountain View, all of Calif.; Richard B. Gold, Burlington, Mass.

[73] Assignee: Watkins-Johnson Company, Palo Alto, Calif.

[21] Appl. No.: 316,130

[22] Filed: Oct. 29, 1981

[51] Int. Cl.³ .............................................. H03F 3/04
[52] U.S. Cl. .................................. 330/277; 330/307; 330/310
[58] Field of Search ............... 330/277, 307, 310, 305; 307/304

[56] References Cited

U.S. PATENT DOCUMENTS 4,277,764  7/1981  Rosier et al. ...................... 330/277

OTHER PUBLICATIONS

Vauken et al. "High Voltage Operation of Power GaAs FET Amplifiers" Sep. 1980 pp. 621–624 Conference: Proceedings of the European Microwave Conference.
Crescenzi et al., "A Monolithic Device for High Gain Amplifiers" Microwaves Jul. 1981.

Primary Examiner—James B. Mullins
Assistant Examiner—Gene Wan
Attorney, Agent, or Firm—Flehr, Hohbach, Test, Albritton & Herbert

[57] ABSTRACT

An RF amplifier including first and second FETs which are interconnected to function as a single transistor with improved gate. An input signal is applied across the gate and source of the first FET, and an output signal is obtained across the drain and source of the second transistor. RF coupling of the FETs is provided by first and second serially connected transmission lines connected between the drain of the first FET and the gate of the second FET. A third transmission line connects the common terminal of the first and second transmission line to circuit ground. In a preferred embodiment, the amplifier comprises a monolithic circuit formed in gallium arsenide with the transmission lines comprising microstrip.

8 Claims, 4 Drawing Figures

RF AMPLIFIER CIRCUIT EMPLOYING FET DEVICES

This invention relates generally to RF amplifier circuits, and more particularly the invention relates to RF amplifiers employing a pair of transitors which function as a single transistor having increased gain.

The use of gallium arsenide FET (field effect transistor) devices in RF amplifier circuits is known, and the devices are particularly useful in microwave amplifier applications. However, prior art amplifier circuits are relatively complex with a maximum gain being limited by the performance of the gallium arsenide transistor in the circuit. The gallium arsenide FET typically includes an insulating substrate of undoped gallium arsenide and a thin surface layer or epitaxial layer of doped gallium arsenide. Spaced ohmic contacts are provided on the surface of the layer over the source and drain regions of the device, and a Schottky contact is made to the surface of the layer intermediate the ohmic contacts and functions as the control gate for the FET.

An object of the present invention is an improved RF amplifier.

Another object of the invention is an RF amplifier having increased amplification gain.

A feature of the invention is the use of a pair of FET devices which function as a single device.

Briefly, a monolithic RF amplifier in accordance with the invention comprises a body of semiconductor material such as III–V compound material. A first FET having source, gate and drain contacts and a second FET having source, gate, and drain contacts are formed in the monolithic body. Means is providing for connecting an input signal across the gate and source contacts of the first FET, and means is provided for receiving an output signal from across the drain and source contacts of the second FET.

An RF passive network interconnects the first FET with the second FET, the RF passive network comprising first and second serially connected transmission lines connected between the drain of the first FET and the gate of the second FET, and a third transmission line interconnected between a common terminal of the first and second transmission lines and a circuit ground potential.

In a preferred embodiment, the coupling means further includes a first resistor and a first capacitor in parallel connecting the source of the first FET to a first potential, a second capacitor connecting the source of the second FET to the first potential, and a second resistor and zenor diode in parallel connecting the third transmission line to the first potential. A second resistor interconnects the third capacitor to the second capacitor as the zenor diode.

In another embodiment, the passive network interconnection further includes a means by which all operating potentials are derived from a single applied potential. A first resistor and a first capacitor in parallel connect between the source of the first FET and circuit ground. A second capacitor and a zenor diode in parallel connect between the third transmission line and circuit ground. A third capacitor connects between the source of the second FET and circuit ground. A second resistor interconnects the third capacitor to the second capacitor and the zenor diode. A single potential is connected between the drain of the second FET and circuit ground.

The invention and objects and features thereof will be more readily apparent from the following detailed description and appended claims when taken with the drawing, in which:

Figure 1:
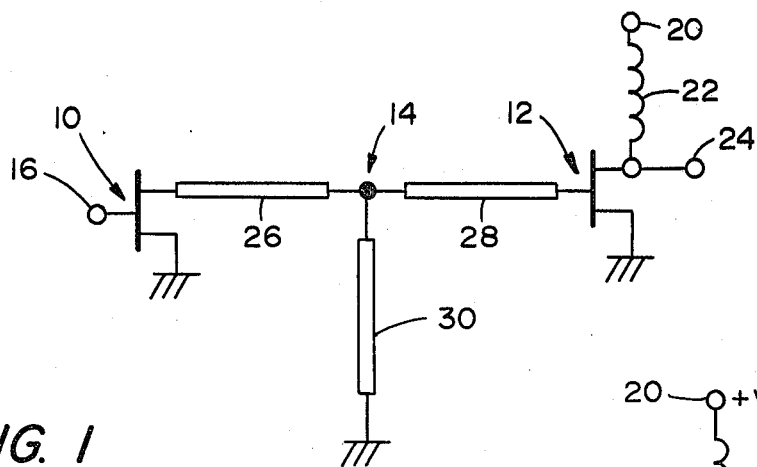
FIG. 1 is an electrical schematic of an RF amplifier in accordance with one embodiment of the invention.

Referring now to the drawings, FIG. 1 is an electrical schematic of one embodiment of an RF amplifier in accordance with the invention. The amplifier includes a first field effect transistor 10, a second field effect transistor 12, and RF interconnection and matching means shown generally at 14 which electrically interconnects transistor 10 and transistor 12.

An input terminal 16 is connected through a band wire 18 to the gate of transistor 10, and the source of transistor 10 is connected to signal (RF) ground. A DC voltage potential contact 20 is connected through inductor 22 to the drain of transistor 12 and the amplifier output terminal 24. The source of transistor 12 is connected to signal (RF) ground.

The RF coupling means 14 comprises a first transmission line 26 and a second transmission line 28 which are serially connected between the drain of transistor 10 and the gate of transistor 12. A third transmission line 30 is connected to a common terminal of the serially connected transmission lines 26, 28 and signal (RF) ground.

In a monolithic form of the circuit, as will be described hereinbelow with reference to FIG. 2, the transmission lines comprise microstrip with the length and impedance of the transmission lines being determined by the operating frequency of the amplifier.

Figure 2:
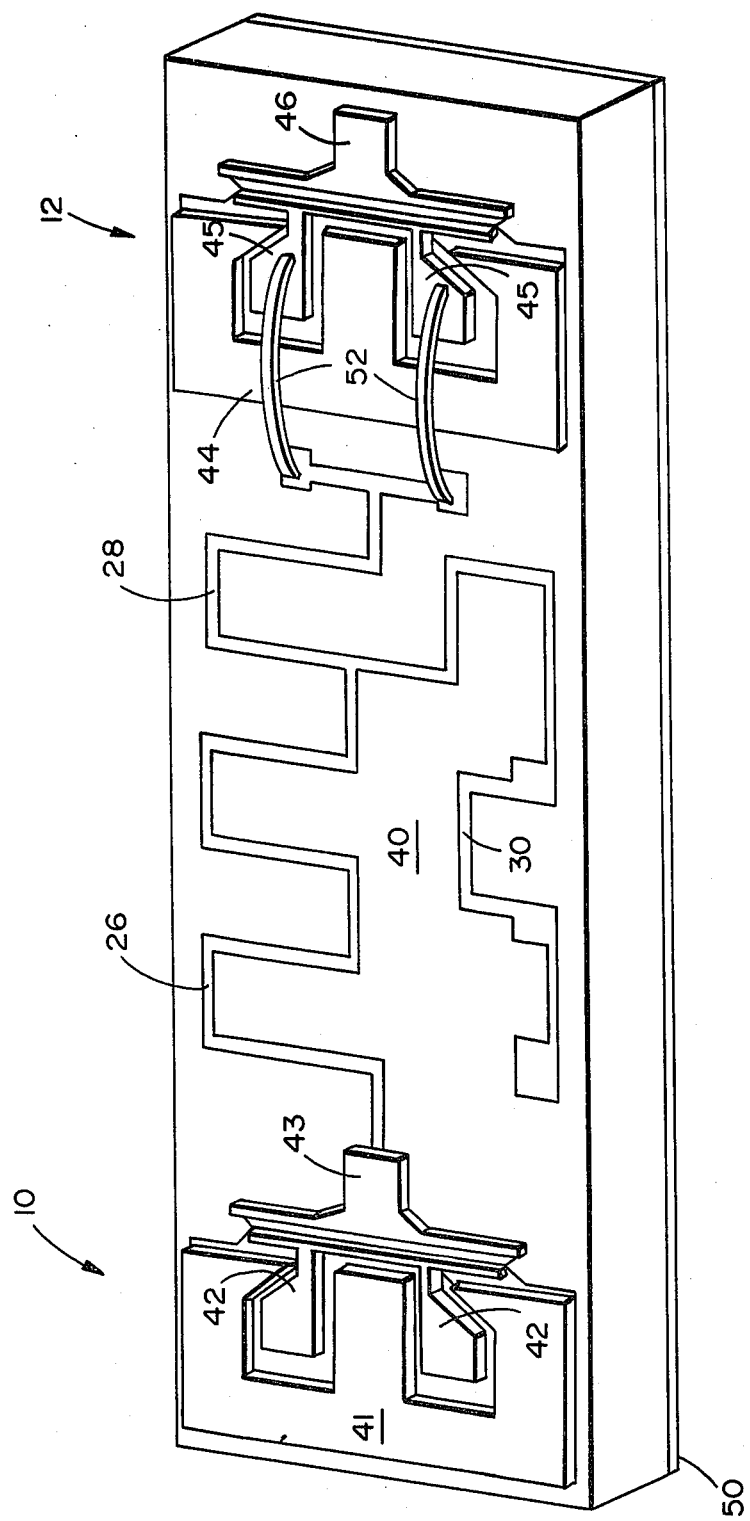
FIG. 2 is a perspective view of the circuit of FIG. 1 in monolithic integrated form.

FIG. 2 is a perspective view of the RF amplifier of FIG. 1 in a monolithic integrated embodiment. Because of the high carrier mobility in III–V compound material, the circuit is preferably formed in a substrate of gallium arsenide and the like for microwave applications. In this embodiment a substrate 40 of gallium arsenide has the first transistor 10 formed in one end thereof and the second transistor 12 formed in the opposite end thereof. The transistors are of conventional structure with the source and drain regions formed in an epitaxial layer which is doped with a suitable dopant such as tin (for gallium arsenide) to establish a thickness of N-type material. The source contact 41 and drain contact 43 are ohmic contact material such as a gold-germanium-nickel alloy, and the gate contact is a Schottky barrier provided by aluminum metallization 42. Similarly, transistor 12 has an ohmic source contact 44, a Schottky barrier contact 45, and an ohmic drain contact 46.

The RF coupling means comprises microstrip including a metal plate 50 on the bottom surface of the gallium arsenide substrate and the conductive patterns 26, 28, and 30 on the top surface. For an X band application (i.e. 7-13 GHz) transmission line 26 has an impedance of 90 ohms and a length of 43 mils, transmission line 28 has an impedance of 90 ohms and a length of 19 mils, and the transmission line 30 has an impedance of 90 ohms and a length of 37 mils. Transmission line 28 is connected to the gate contacts 45 of transistor 12 by means of conductive metal bridges 52 which physically contact the gallium arsenide body only at the contact points of the transmission line 28 and the gate contacts 45.

Figure 3:
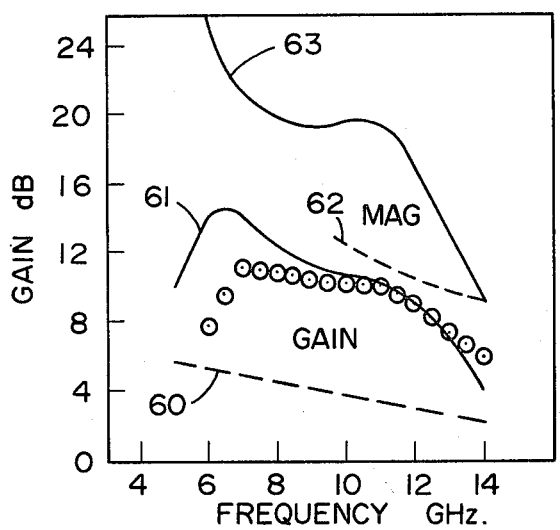
FIG. 3 is a plot of gain versus operating frequency for the embodiment of FIG. 2.

FIG. 3 is a plot of gain versus operating frequency for the device of FIG. 2. The broken lines 60 and 62 represent the gain of an equivalent gallium arsenide amplifier circuit having a single field effect transistor, and the solid lines 61 and 63 are of the gain of the amplifier of FIG. 2. As noted, the gain of the circuit of FIG. 2 is about 6 db higher than that of a single transistor amplifier circuit.

Figure 4:
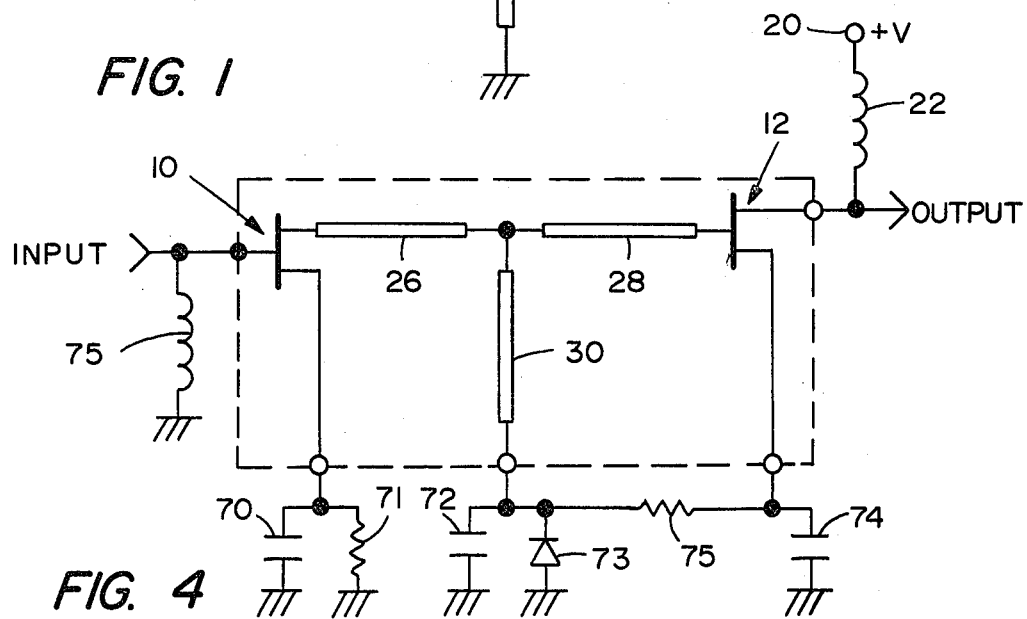
FIG. 4 is an electrical schematic of another embodiment of the invention.

FIG. 4 is an electrical schematic of the circuit of FIG. 1 and including additional biasing circuitry providing both RF and DC grounds in accordance with another embodiment of the invention. In this embodiment the source of transistor 10 is connected through the parallel capacitor 70 and resistor 71 to circuit ground, and the gate of transistor 10 is connected through inductor 75 to circuit ground. Transmission line 30 is connected through capacitor 72 to circuit ground with a zenor diode 73 shunting capacitor 72 to limit the maximum voltage thereacross. The source of transistor 12 is connected through capacitor 74 to ground, and a resistor 75 interconnects capacitor 74 and the capacitor 72 and zenor diode 73. A DC voltage potential contact 20 is connected through an inductor 22 to the drain of transistor 12. This single DC contact point 20 provides the DC bias for both transistors 12 and 10 through the network of FIG. 4.

The RF amplifier in accordance with the present invention has received industry recognition as noted in the July 1981 issue of MICROWAVES magazine. The circuit provides increased gain and has been demonstrated to be stable in operation. The amplifier is readily fabricated using conventional semiconductor technology and the circuitry can be readily tailored to desired operating frequencies. The circuit functions in a manner similar to a single common source gallium arsenide field effect transistor amplifier but with increased gain and improved reverse isolation.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. An RF amplifier comprising:
   a first FET having source, drain, and gate contacts,
   a second FET having source, drain, and gate contacts,
   means for applying an input signal to said gate contact of said first FET,
   means connecting said source of said first FET to a first potential,
   means connecting said source contact of said second FET to a second potential,
   means connecting said drain contact of said second FET to a third potential,
   coupling means for coupling said first FET with said second FET, said coupling means including first and second serially connected transmission lines connected between said drain contact of said first FET and said gate contact of said second FET, and a third transmission line interconnected to a common terminal of said first and second transmission lines and a fourth potential, and
   means for extracting an output signal from said drain contact of said second FET,
   said RF amplifiers being characterized by said first FET and said second FET being formed in a monolithic semiconductor body with said first transmission line, said second transmission line, and said third transmission line comprising microstrip on a surface of said semiconductor body.

2. An RF amplifier as defined by claim 1 wherein said second potential and said fourth potential are identical to said first potential.

3. An RF amplifier as defined by claim 1 wherein said semiconductor body comprises III–V compound semiconductor material, and said microstrip comprises a ground plate on one surface of said body and a conductive pattern on an opposite surface of said body.

4. An RF amplifier as defined by claim 3 wherein said III–V compound semiconductor material is gallium arsenide.

5. An RF amplifier as defined by claim 2 or 4 wherein said coupling means further includes a first resistor and a first capacitor in parallel connecting said source of said first FET to said first potential, a second capacitor connecting said source of said second FET to said first potential, a second resistor and a zenor diode in parallel connecting said third transmission line to said first potential, and a second resistor interconnecting said third capacitor with said second capacitor and said xenor diode.

6. An RM amplifier as defined by claim 5 wherein said first potential is circuit ground.

7. A monolithic RF amplifier comprising a body of gallium arsenide semiconductor material, a first FET having source, gate, and drain contacts in said body and a second FET having source, gate, and drain contacts in said body, means for connecting an input signal across said gate and source contacts of said first FET, means for receiving an output signal from across said drain and source of said second FET, and RF coupling means interconnecting said first FET and said second FET, said RF coupling means comprising first and second serially connected transmission lines connected between the drain of said first FET and the gate of said second FET, and a third transmission line interconnected between a common terminal of said first and second transmission lines and a circuit ground potential.

8. The monolithic RF amplifier as defined by claim 7 wherein said transmission lines comprise microstrip including a ground plate on one surface of said body and a conductive pattern on an opposite surface of said body.

* * * * *

UNITED STATES PATENT AND TRADEMARK OFFICE
CERTIFICATE OF CORRECTION

PATENT NO. : 4,423,388
DATED : Dec. 27, 1983
INVENTOR(S) : Emil J. Crescenzi, Jr. et al It is certified that error appears in the above—identified patent and that said Letters Patent is hereby corrected as shown below:

| | |
|---|---|
| In the Abstract, Line 3 | "gate" should be --gain--. |
| Column 1, Line 55 | "as" should be --at--. |
| Column 2, Line 21 | "band" should be --bond--. |
| Column 4, Line 34 | "a second resistor and a zenor diode in parallel" should be --a third capacitor and a zenor diode in parallel--. |
| Column 4, Line 36 | "Xenor" should be --Zenor--. |
| Column 4, Line 39 | "RM" should be --RF--. |

Signed and Sealed this

Twenty-second Day of May 1984

[SEAL]

Attest:

*Attesting Officer*

GERALD J. MOSSINGHOFF
*Commissioner of Patents and Trademarks*